(12) United States Patent
Chang

(10) Patent No.: US 7,512,017 B2
(45) Date of Patent: Mar. 31, 2009

(54) INTEGRATION OF PLANAR AND TRI-GATE DEVICES ON THE SAME SUBSTRATE

(75) Inventor: Peter L. D. Chang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 478 days.

(21) Appl. No.: 11/313,351

(22) Filed: Dec. 21, 2005

(65) Prior Publication Data

US 2007/0138514 A1    Jun. 21, 2007

(51) Int. Cl.
*G11C 11/40* (2006.01)

(52) U.S. Cl. ............... 365/188; 257/E21.442; 257/E21.661; 257/E27.1; 438/275

(58) Field of Classification Search .......... 365/188; 257/E21.442, E21.661, E27.1
See application file for complete search history.

(56) References Cited

U.S. PATENT DOCUMENTS

| | | | |
|---|---|---|---|
| 5,804,848 A | 9/1998 | Mukai | |
| 5,844,278 A | 12/1998 | Mizuno et al. | |
| 5,899,710 A | 5/1999 | Mukai | |
| 6,018,176 A | 1/2000 | Lim | |
| 6,066,869 A | 5/2000 | Noble et al. | |
| 6,271,542 B1 | 8/2001 | Emma et al. | |
| 6,413,802 B1 | 7/2002 | Hu et al. | |
| 6,459,123 B1 | 10/2002 | Enders et al. | |
| 6,472,258 B1 | 10/2002 | Adkisson et al. | |
| 6,525,403 B2 | 2/2003 | Inaba et al. | |
| 6,562,665 B1 | 5/2003 | Yu | |
| 6,583,469 B1 | 6/2003 | Fried et al. | |
| 6,611,029 B1 | 8/2003 | Ahmed et al. | |
| 6,630,388 B2 | 10/2003 | Sekigawa et al. | |
| 6,635,909 B2 | 10/2003 | Clark et al. | |

(Continued)

FOREIGN PATENT DOCUMENTS

WO    WO2004084292    9/2004

(Continued)

OTHER PUBLICATIONS

Zheng Guo et al., "FinFET-based SRAM design," Proceedings of the 2005 IEEE International Symposium on Low Power Electronics and Design, San Diego, CA, Aug. 8, 2005.

(Continued)

*Primary Examiner*—Jerome Jackson, Jr.
*Assistant Examiner*—Paul A Budd
(74) *Attorney, Agent, or Firm*—Blakely, Sokoloff, Taylor & Zafman LLP

(57) ABSTRACT

An apparatus including a first diffusion formed on a substrate, the first diffusion including a pair of channels, each of which separates a source from a drain; a second diffusion formed on the substrate, the second diffusion including a channel that separates a source from a drain; a first gate electrode formed on the substrate, wherein the first gate electrode overlaps one of the pair of channels on the first diffusion to form a pass-gate transistor; and a second gate electrode formed on the substrate, wherein the second gate electrode overlaps one of the pair of channels of the first diffusion to form a pull-down transistor and overlaps the channel of the second diffusion to form a pull-up transistor, and wherein the pass-gate, pull-down and pull-up transistors are of at least two different constructions. Other embodiments are disclosed and claimed.

8 Claims, 12 Drawing Sheets

U.S. PATENT DOCUMENTS

| | | |
|---|---|---|
| 6,642,090 B1 | 11/2003 | Fried et al. |
| 6,657,259 B2 | 12/2003 | Fried et al. |
| 6,689,650 B2 | 2/2004 | Gambino et al. |
| 6,770,516 B2 | 8/2004 | Wu et al. |
| 6,787,402 B1 | 9/2004 | Yu |
| 6,794,718 B2 | 9/2004 | Nowak et al. |
| 6,798,000 B2 | 9/2004 | Luyken et al. |
| 6,800,910 B2 | 10/2004 | Lin et al. |
| 6,803,631 B2 | 10/2004 | Dakshina-Murthy et al. |
| 6,812,075 B2 | 11/2004 | Fried et al. |
| 6,815,277 B2 | 11/2004 | Fried et al. |
| 6,821,834 B2 | 11/2004 | Ando |
| 6,833,588 B2 | 12/2004 | Yu et al. |
| 6,835,614 B2 | 12/2004 | Hanafi et al. |
| 6,849,884 B2 | 2/2005 | Clark et al. |
| 6,867,460 B1 * | 3/2005 | Anderson et al. ............ 257/351 |
| 6,869,868 B2 | 3/2005 | Chiu et al. |
| 6,885,055 B2 | 4/2005 | Lee |
| 6,897,527 B2 | 5/2005 | Dakshina-Murthy et al. |
| 6,924,560 B2 * | 8/2005 | Wang et al. .................... 257/67 |
| 6,949,768 B1 | 9/2005 | Anderson et al. |
| 7,414,877 B2 * | 8/2008 | Burnett et al. ............... 365/154 |
| 2004/0266076 A1 | 12/2004 | Doris et al. |
| 2006/0281236 A1 * | 12/2006 | Datta et al. .................. 438/157 |
| 2007/0045748 A1 | 3/2007 | Booth, Jr. et al. |
| 2007/0069293 A1 * | 3/2007 | Kavalieros et al. .......... 257/350 |
| 2007/0108528 A1 * | 5/2007 | Anderson et al. ............ 257/365 |
| 2007/0264762 A1 * | 11/2007 | Yeo et al. ..................... 438/157 |
| 2008/0128759 A1 * | 6/2008 | Chang ......................... 257/259 |

OTHER PUBLICATIONS

PCT International Search Report for Application No. PCT/US2006/047149, May 4, 2007.

Choi, Yang-Kyu et al., "Sub-20nm CMOS FinFET Technologies," IEEE, 2001.

Park, Jong-Tae et al., "Pi-Gate SOI MOSFET," IEEE Electron Device Letters, vol. 22, No. 8, Aug. 2001, pp. 405-406.

Lee, C.H., et al., Novel Body Tied FinFet Cell Array Transistor DRAM with Negative Word Line Operation for Sub 60nm Technology and Beyond, IEEE, 2004, pp. 130-131.

International Preliminary Report on Patentability and PCT Written Opinion PCT/US2006/047149, mailed Jun. 24, 2008.

* cited by examiner

INTEGRATION OF PLANAR AND TRI-GATE DEVICES ON THE SAME SUBSTRATE

TECHNICAL FIELD

The present invention relates generally to semiconductor transistors and in particular, but not exclusively, to memory cells including transistors of different types integrated onto the same substrate.

BACKGROUND

FIG. 1A schematically illustrates an embodiment of a static random access memory (SRAM) cell 100. The SRAM cell 100 includes a pair of inverters 102 and 104, with the output of inverter 102 coupled to the input of inverter 104, and the output of inverter 104 coupled to the input of inverter 102. Coupling inverters 102 and 104 in this manner results in a self-sustaining memory cell. In addition to the inverters 102 and 104, SRAM cell 100 includes a pair of pass-gate transistors 106 and 108. Pass-gate transistor 106 is coupled to the input of inverter 102 and the output of inverter 104, while pass-gate transistor 108 is coupled to the output of inverter 102 and to the input of inverter 104.

FIG. 1B schematically illustrates an ideal SRAM cell 150 that is a semiconductor implementation of the SRAM cell 100. The SRAM cell 150 includes a pair of pass-gate transistors 170 and 176, a first inverter made up of pull-down transistor 178 and pull-up transistor 180, and a second inverter made up of pull-down transistor 172 and pull-up transistor 174. In one embodiment, the pass-gate and pull-down transistors are NMOS and the pull-up transistor is PMOS. SRAM cell 150 is thus a six-transistor SRAM cell, because it includes a total of six transistors. Normally, all six transistors in SRAM cell 150 are of the same construction, such as planar transistor or trigate transistors.

The SRAM cell 150 includes several "diffusions" 154, 156, 158 and 160 of variable width W built on a substrate 152. Each diffusion includes at least one source, at least one drain and at least one channel separating each source/drain pair. Also built on substrate 152 are several gate electrodes 162, 164, 166 and 168 of variable gate length H. A transistor is formed at selected places where the gate electrodes overlap with the diffusions. For example, pass-gate transistor 170 is formed at the overlap of diffusion 154 with gate electrode 162, pull-down transistor 172 is formed at the overlap of diffusion 154 and gate electrode 166, and pull-up transistor 174 is formed at the overlap of diffusion 156 and gate electrode 166. SRAM cell 150 is an "ideal" cell because, as explained below, it is difficult, if not impossible, to have diffusions and gate electrodes of constant width in an SRAM cell where all transistors are of the same type.

FIGS. 2A and 2B illustrate a pair of approaches to tuning the relative strengths of the transistors in SRAM cell 150. For SRAM cell 150 to operate in a stable fashion, it is better for the transistors that form SRAM cell 150 to have different strengths: for stable operation, pull-down transistors 172 and 178 may be the strongest, pass-gate transistors 170 and 176 the next strongest, and pull-up transistors 174 and 180 the weakest. For a particular transistor construction, the strength of the transistor is adjusted by changing the width W of the diffusions, the gate length H of the gate electrode, or both. For a given value of W, a larger value of H creates a weaker transistor; similarly, for a given value of H, a larger W creates a stronger transistor. In general, PMOS transistors are weaker than NMOS transistors with the same W and H. The pull-up transistor can have the same W and H as the pass-gate so that the pull-up transistor is the weakest.

FIG. 2A illustrates an embodiment of an SRAM cell 200 in which the width W of the diffusions is changed to vary the strength of the transistor. Thus, diffusion 202 has a first width W1 where it intersects gate electrode 210 to form the pass-gate transistor and a second width W2 where it intersects gate electrode 212 to form the pull-down transistor. Because W1 is smaller than W2, the resulting pass-gate transistor is weaker than the pull-down transistor. Similarly, diffusion 206 is narrower where it intersects gate electrode 216 to form the pass-gate transistor and wider where it intersects gate electrode 214 to form the pull-down transistor. FIG. 2B illustrates an embodiment of an SRAM cell 250 in which the length H of the gate electrodes is varied to vary the transistor strength. Thus, gate electrode 252 has a first width H1 where it intersects diffusion 260 to form the pull-down transistor and a second width H2 where it intersects diffusion 262 to form the pull-down transistor. Because H1 is smaller than H2, the resulting pass-gate transistor is weaker than the pull-down transistor. Similarly, gate electrode 256 is narrower where it intersects diffusion 266 to form the pass-gate transistor and wider where it intersects diffusion 264 to form the pull-down transistor.

The techniques employed in FIGS. 2A and 2B suffer from several problems. Efficient patterning and etching of the diffusions and gate electrodes prefers that both should be straight lines. But varying the width W of the diffusions creates "jogs" 204 and 208, while varying the width H of the gate electrodes also creates jogs 254 and 258. For sub-100 nm technologies, the gate length H and diffusion width W are less than the wavelength of light used to photolithographically pattern the diffusions and gate electrodes, the presence of these jogs substantially increases the complexity of the masks used to pattern the features, as well as the difficulty of properly etching the features once patterned.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Embodiments of an apparatus, system and method for integrating different types of transistors in a static random access memory (SRAM) cell are described herein. In the following description, numerous specific details are described to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail but are nonetheless encompassed within the scope of the invention.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in this specification do not necessarily all refer to the same embodiment. Furthermore, the particular features, structures, or characteristics may be combined in any suitable manner in one or more embodiments.

Figure 3:
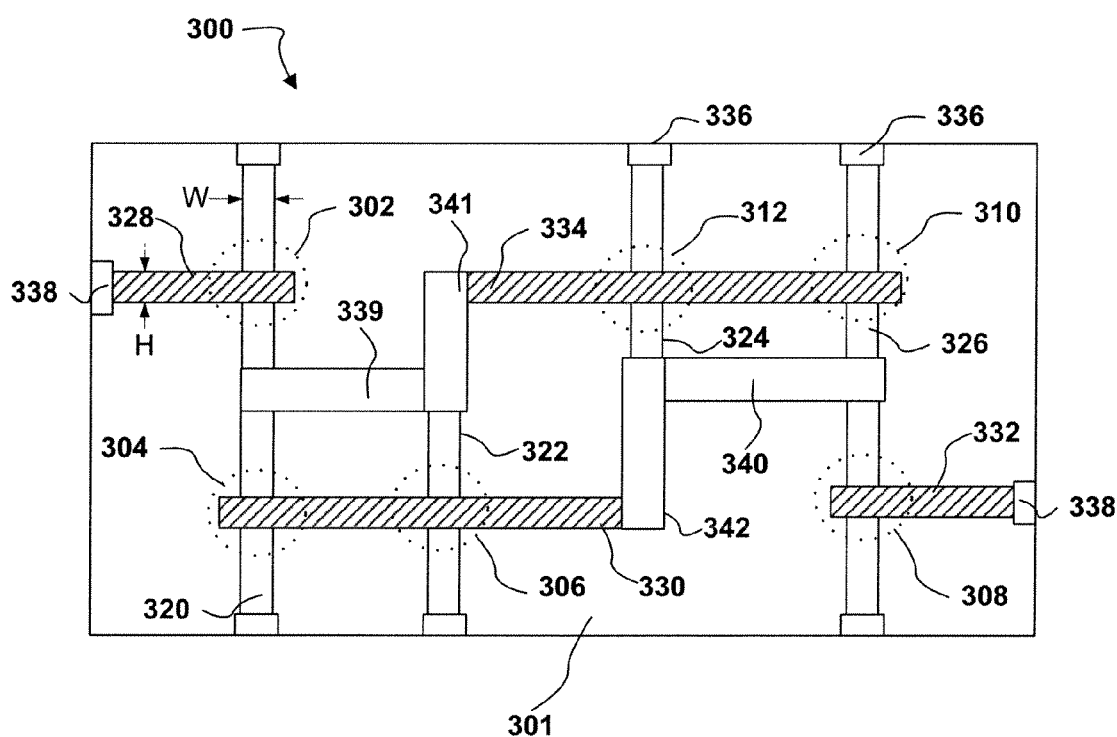
FIG. 3 is a plan view an SRAM cell according to the present invention.

FIG. 3 illustrates the top view of an embodiment of a semiconductor SRAM cell 300 according to the present invention. SRAM cell 300 includes a substrate 301 on which are built first diffusion 320, second diffusion 322, third diffusion 324 and fourth diffusion 326. Also built on the substrate are first gate electrode 328, second gate electrode 330, third gate electrode 332 and fourth gate electrode 334. The diffusions and gate electrodes are connected to an electrical signal nodes, for example by means of connectors 336, 338, 339, 340, 341 and 342.

Substrate 301 can include one or more layers of any well-known insulating substrate such as silicon dioxide, nitrides, oxides, and sapphires. In other embodiments, the substrate 301 can be a semiconductor, such as but not limited to mono-crystalline silicon (i.e., single-crystal silicon) and gallium arsenide. In still other embodiments, the substrate 301 can include combinations or sub-combinations of layers of insulators, conductors or semiconductor In SRAM cell 300, each individual diffusion 320, 322, 324 and 326 has a substantially uniform width W, although this is not necessary in general. To ensure proper cell stability, the transistors on two sides of the cell should be matched. For example, transistor 302 should be the same as transistor 308, 304 same as 310, and 306 same as 312. Transistors in a pair should have the same gate lengths and diffusion widths. For example, the gate length of gate 328 should be the same as that of gate 332. Diffusions 320, 322, 324 and 326 can be formed of any well-known semiconductor material, such as but not limited to silicon (Si), germanium (Ge), silicon germanium ($Si_xGe_y$), gallium arsenide (GaAs), InSb, GaP, GaSb and carbon nanotubes. Similarly, each individual gate electrode 328, 330, 332 and 334 has substantially uniform width H, but the width of a particular gate electrode need not be the same as the width of any other gate electrode. Gate electrodes 328, 330, 332 and 334 can be formed using a semiconductor such as those used for the diffusions, or can be formed of a conductor including one or more of a metal, a metal compound, or a metal alloy.

As in SRAM cell 150, a transistor is formed at selected places where the gate electrodes overlap channels in the diffusions. For example, pass-gate transistor 302 is formed at the overlap of diffusion 320 with gate electrode 328, a first pull-down transistor 304 is formed at the overlap of diffusion 320 and gate electrode 330, and a first pull-up transistor 306 is formed at the overlap of diffusion 322 and gate electrode 330. Similarly, a second pass-gate transistor 308 is formed at the overlap of diffusion 326 and gate electrode 332, a second pull-down transistor is formed at the overlap of diffusion 326 and gate electrode 334, and a second pull-up transistor is formed at the overlap of diffusion 324 and gate electrode 334.

Figure 1A:
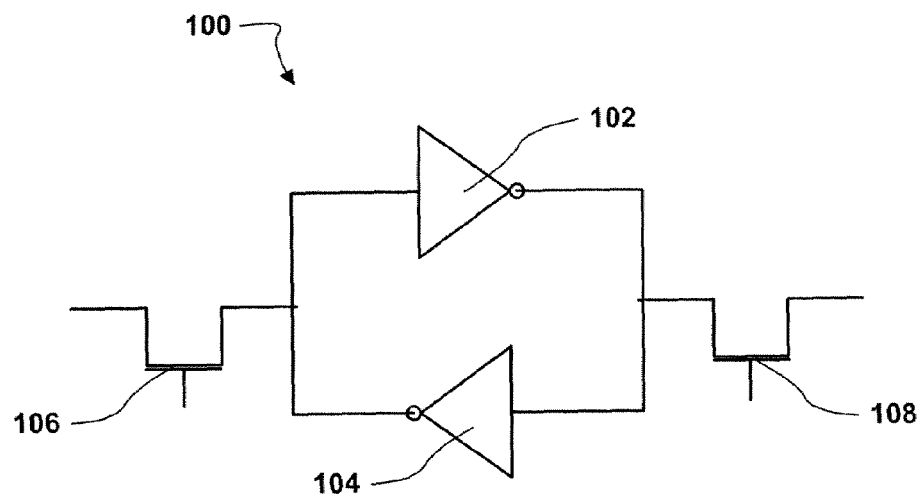
FIG. 1A is a schematic drawing of an embodiment of a static random access memory (SRAM) cell.
Figure 1B:
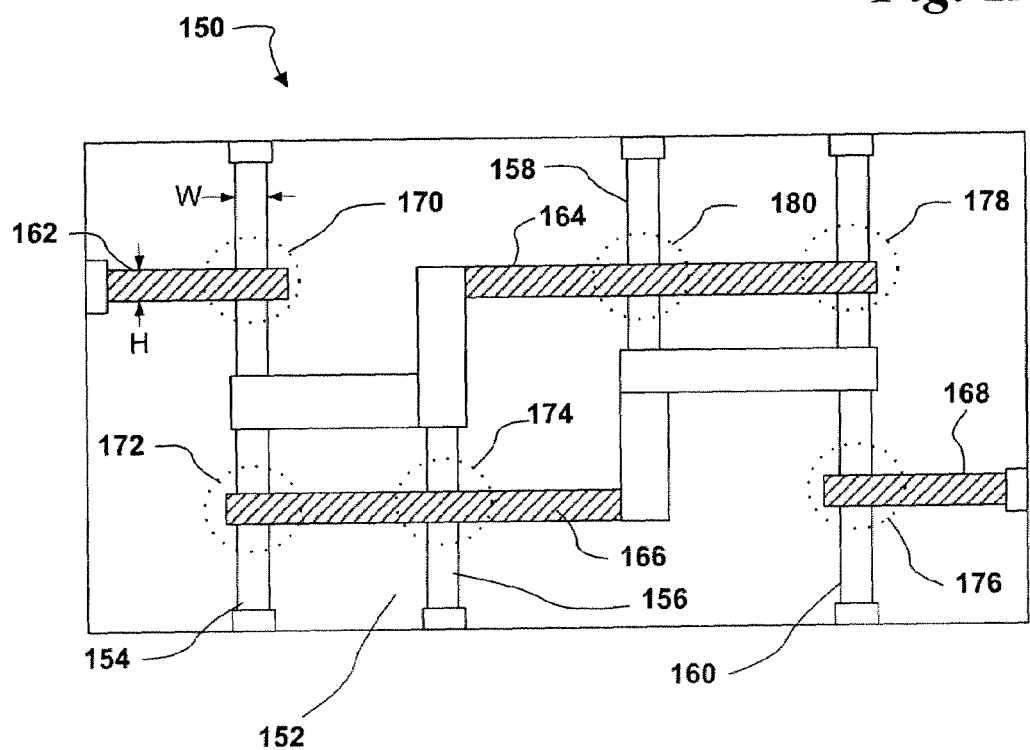
FIG. 1B is a plan view of the construction of an SRAM cell on a semiconductor substrate.
Figure 2A:
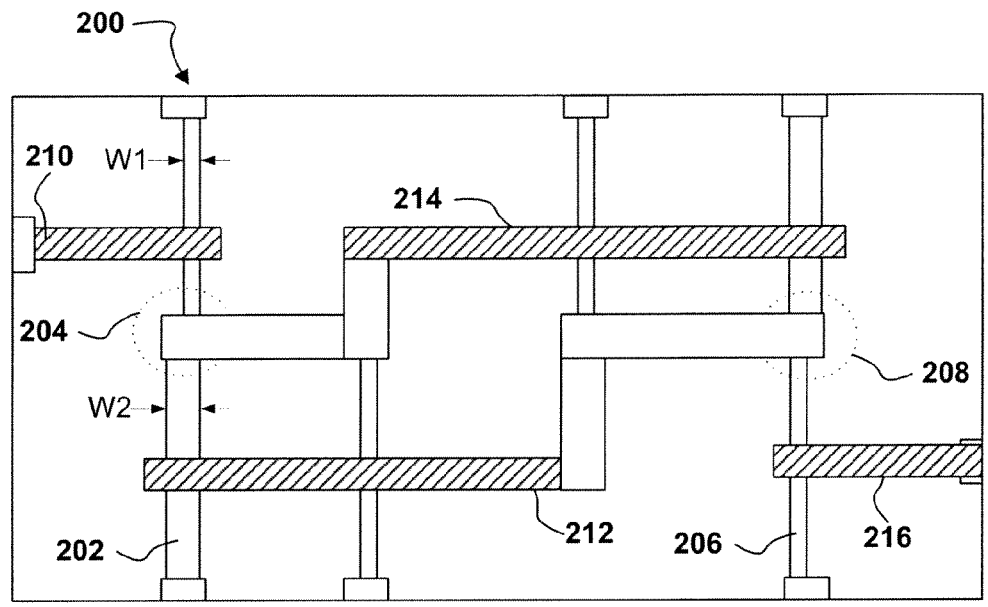
FIG. 2A is a plan view an embodiment of a technique used to control the strength of the transistors in an embodiment of an SRAM cell.
Figure 2B:
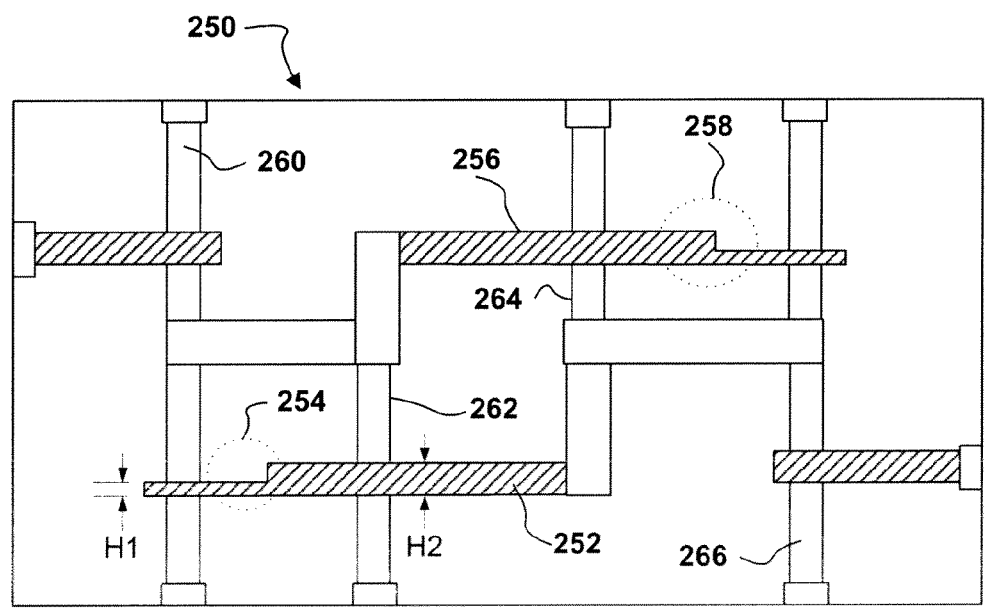
FIG. 2B is a plan view of an alternative embodiment of a technique used to control the strength of the transistors in an embodiment of an SRAM cell.

Unlike SRAM cell 150, however, in the SRAM cell 300 the diffusions and gate electrodes are structured such that the transistors formed at their overlaps can be of different types (i.e., they can have different constructions). In one embodiment, for example, pass-gate transistors 302 and 308 can be planar transistors, pull-down transistors 304 and 310 tri-gate transistors, and pull-up transistors 306 and 312 planar transistors. In another embodiment, pass-gate transistors 302 and 308 can be planar transistors while pull-down transistors 304 and 310 and pull-up transistors 306 and 312 are all tri-gate transistors. In yet another embodiment, the pass-gate transistors 302 and 308, and pull-up transistors 306 and 312, may be trigate transistors with shallow sidewalls and the pull-down transistor 304 and 310 are trigate transistors with deeper sidewalls. Of course, other combinations of planar and tri-gate transistors besides those mentioned above can be used in other embodiments. Integration of the two or more transistor types on the same wafer can offer devices with different device characteristics with the same layout. In general, this concept is applicable to any circuits that require different transistor strengths. When applied to SRAM cells, this allows the transistors in the cells to have substantially constant diffusion widths and gate widths, which eliminates the jogs in layouts (see FIGS. 2A-2B) and simplifies the lithography patterning. The substantially constant diffusion width and gate electrode width also allow smaller SRAM cell areas.

Figure 4:
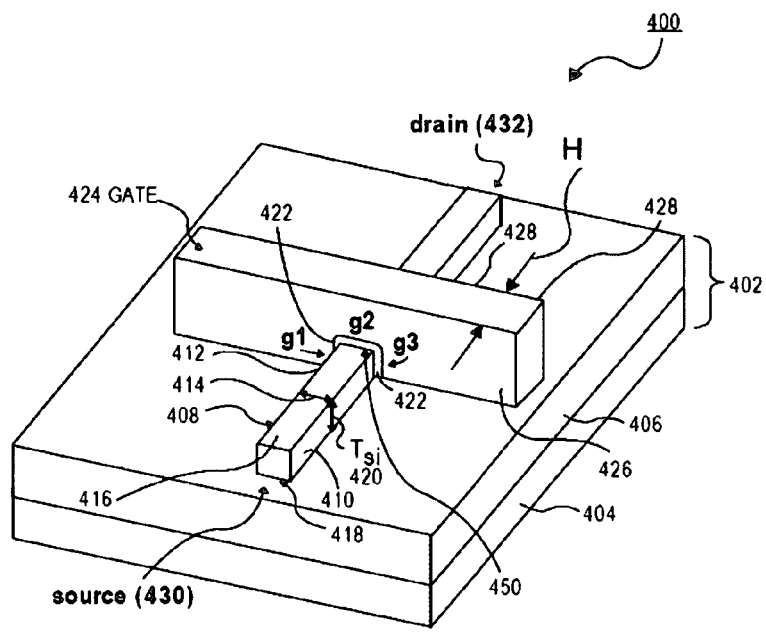
FIG. 4 is a perspective view of an embodiment of a tri-gate transistor usable in embodiments of the present invention.

FIG. 4 illustrates an embodiment of a tri-gate transistor 400 that can be used for one or more transistors in SRAM cell 300. Tri-gate transistor 400 is formed on a substrate 402 that, in the embodiment shown, includes a lower mono-crystalline silicon substrate 404 and an insulating layer 406, such as a silicon dioxide film. Tri-gate transistor 400 includes a diffusion 408 formed on insulator 406. Diffusion 408 includes a source region 430 and a drain region 432 formed on opposite sides of a gate electrode 424. Source region 430 and drain region 432 are formed of the same conductivity type such as n-type or p-type conductivity.

A channel region 450 is located in the diffusion 408 between source region 430 and drain region 432. The channel region 450 can also be defined as the area of the diffusion 408 surrounded by the gate electrode 424. If channel region is doped at all, it is typically doped to the opposite conductivity type of the source region 430 and the drain region 432. Channel region 450 can be uniformly doped or can be doped non-uniformly or with differing concentrations to provide particular electrical and performance characteristics.

Gate electrode 424 of length H is formed over channel region 450 and is separated from diffusion 408 by dielectric layer 422. By providing dielectric 422 and gate electrode 424, both of which surround the channel 450 on three sides, the tri-gate transistor has three channels and three gates: one (g1) along side 412, a second (g2) along the top surface 416, and the third (g3) along the sidewall 410. The effective gate "width" of transistor 400 is the sum of height 420 of diffusion 408 at sidewall 410, plus the width 414 of diffusion of 408 at the top surface 416, plus the height 420 of diffusion 408 at sidewall 412. The sidewalls 412 and 410 provide additional conducting surfaces in addition to a planar device that utilizes only the top surface 416. The strength of a trigate transistor increases with the height of sidewalls, which may provide the desired transistor strengths given the same layout in diffusion width and gate lengths.

Because the channel region 450 is surrounded on three sides by gate electrode 424 and gate dielectric 422, transistor 400 can be operated in a fully depleted manner wherein when transistor 400 is turned "on" the channel region 450 fully depletes thereby providing the advantageous electrical characteristics and performance of a fully depleted transistor. That is, when transistor 400 is turned "ON" a depletion region is formed in channel region 450 along with an inversion layer at the surfaces of region 450 (i.e., an inversion layer is formed on the side surfaces and top surface of the diffusion). The inversion layer has the same conductivity type as the source and drain regions and forms a conductive channel between the source and drain regions to allow current to flow from source to drain.

Figure 5:
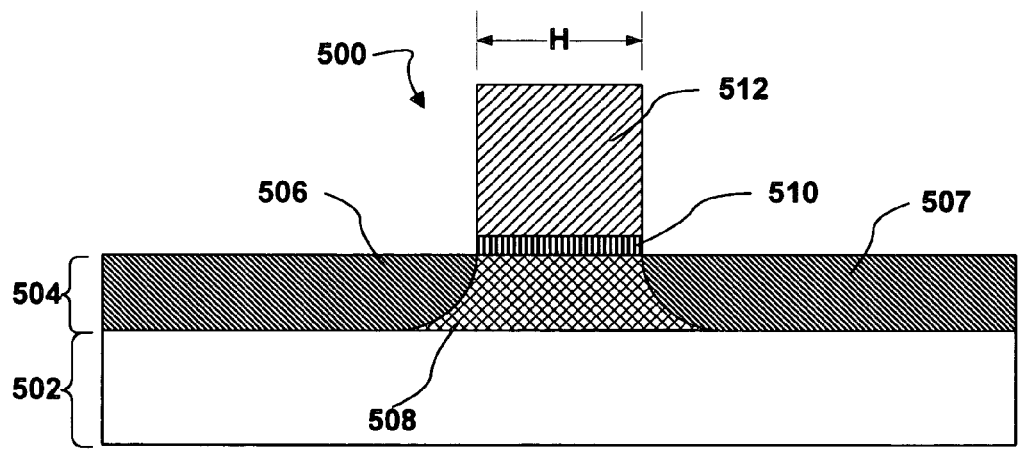
FIG. 5 is a cross-sectional elevation of an embodiment of a planar transistor usable in embodiments of the present invention.

FIG. 5 illustrates an embodiment of a planar transistor 500 that can be used for one or more transistors in an SRAM cell such as SRAM cell 300. Planar transistor 500 includes a substrate 502 on which is formed a diffusion 504, a dielectric layer 510 and a gate electrode 512. The diffusion 504 includes a source 506 and a drain 507, separated from each other by a channel 508. In the illustrated embodiment, the source 506 and drain 507 are doped so that they exhibit n-type conductivity, while the channel 108 is doped so that it exhibits p-type conductivity; planar transistor 500 is thus an NMOS transistor. In other embodiments, however, the diffusion 504 can include a pair of p-type conductivity regions separated from each other by an n-type conductivity region—in other words, a PMOS transistor. The gate electrode 512 has length H and sits above the channel 508, but is separated from the channel by a dielectric 510.

Figure 6A:
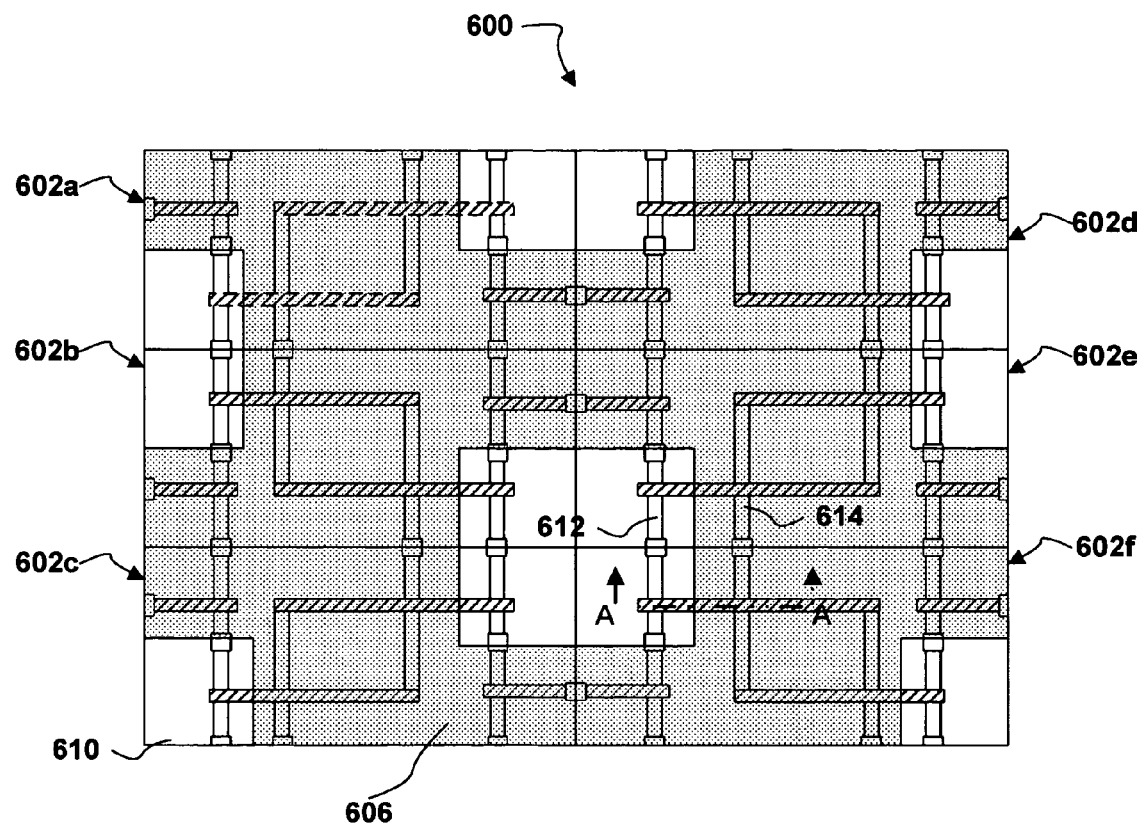
FIG. 6A is a plan view of a group of SRAM cells masked to create a group of SRAM cells according to the present invention.
Figure 6B:
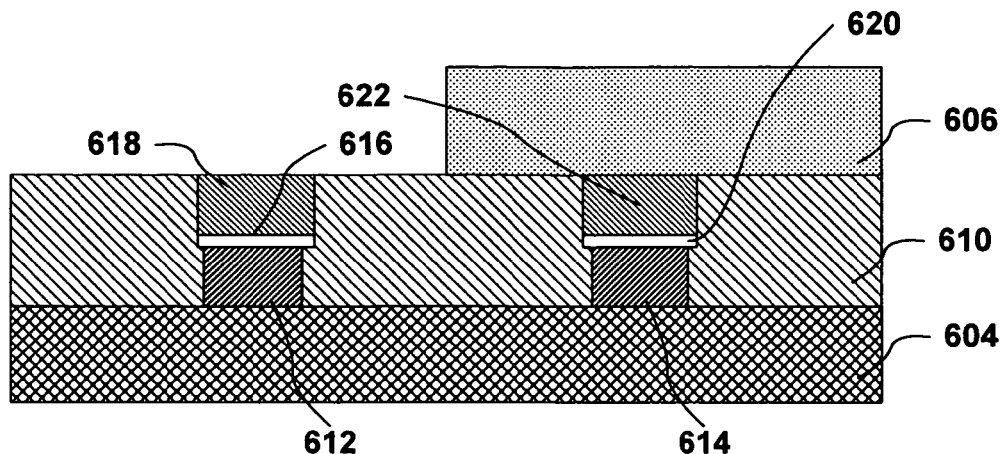
FIGS. 6B-6G are cross-sectional elevations taken substantially along section line A-A in FIG. 6A, showing an embodiment of a process for building an embodiment of an SRAM cell according to the present invention.

FIGS. 6A-6G illustrate an embodiment of a process for building an embodiment of an SRAM cell that integrates two different transistor types (i.e., two different constructions), such as SRAM cell 300. The figures are illustrated for SOI wafers. However, the process is applicable to bulk wafers as well. FIGS. 6A and 6B together illustrate an initial part of the process; FIG. 6A in top view and FIG. 6B in cross-section. FIG. 6A illustrates a set of SRAM cells 600 that includes six individual SRAM cells 602a-602f formed on substrate 604. As an initial matter, in FIGS. 6A and 6B the diffusions 612 and 614 have been patterned on the substrate 604. Gate electrodes have not been formed on the substrate at this stage, but they are nonetheless shown in FIG. 7A to illustrate their positions. The diffusion patterning may be accomplished with typical shallow trench isolation process. A pad oxide may be thermally grown on Si, followed by a deposition of silicon nitride. Photo resist is patterned on SiN to open up regions for etching to isolate the silicon diffusions. After the isolation etching, diffusion 612 has a layer of pad oxide 616 and an isolation nitride 618. Diffusion 614 similarly has a layer of pad oxide 620 and an isolation nitride 622. Depending on the detailed dimensions (see section [0034]) and quality of the sidewalls, it may be desirable to oxidize the diffusions to create a slight undercuts under the isolation nitride and pad oxide. A layer of trench oxide 610 is deposited on substrate 604 and planarized to the top surface of isolation nitride 618. The remaining trench oxide will fill in spaces isolating diffusions. A layer of photoresist 606 is deposited over all the components and is developed to expose an area of the substrate including only the diffusions, or those portions of diffusions, that will be part of tri-gate transistors.

Figure 6C:
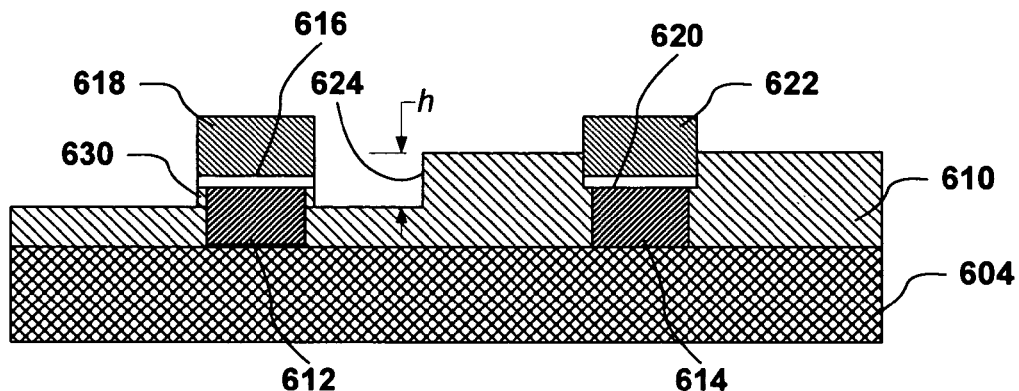

FIG. 6C illustrates the transistor construction after an initial selective dry etch that etches silicon oxide without etching the isolation nitride. Beginning with the structure of FIG. 6B, the dry etch may strip away photoresist 606 and etches away a height h of the area of trench oxide 610 that was not under the photoresist 606. The height h is equal to the target sidewall height difference between the two types of transistors, for example, the transistor on diffusion 612 and the transistor on diffusion 614. For a planar transistor on diffusion 614 and a trigate transistor on diffusion 612 with full height of silicon body, the height difference h should be the silicon body height. If the sidewall is to be smaller than the full thickness of diffusion, such as in the logic area, an additional lithography may be applied to etch back the logic area separately. If the height difference h is larger than the thickness of isolation nitride, an undercut in diffusion 612 can leave a thin layer of oxide 630 on the sidewall to protect it from subsequent etch to remove silicon nitride. A dry etch is used so that the height h can be carefully controlled, as well as to prevent undercut along surface 624. In other embodiments of the process, of course, other types of etching, such as wet etching, can be used. The resist and dry etch steps can be applied after trench oxide planarization and the isolation oxide recess. The advantage of patterning after the recess is to reduce the lateral etch due to wet etch.

Figure 6D:
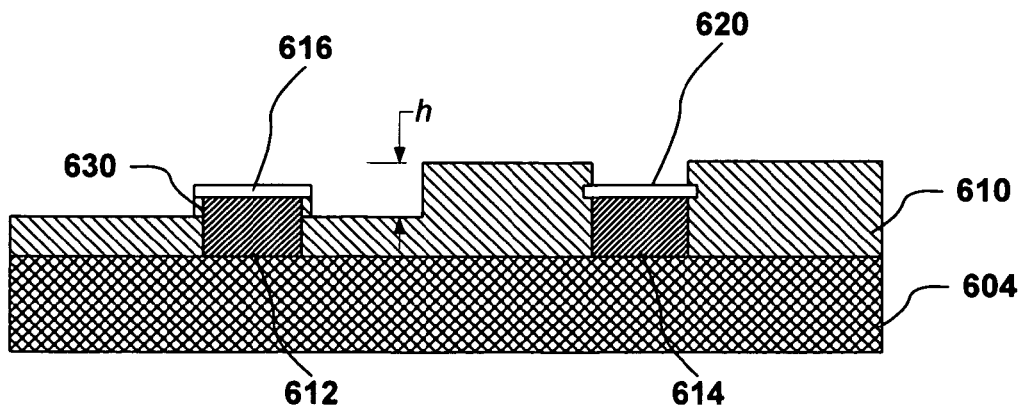

FIG. 6D illustrates the transistor construction after removal of the isolation nitride. Starting with the construction of FIG. 6C, the isolation nitride 618 and isolation nitride 622 are both removed through appropriate etching. The etchant used to remove isolation nitride 618 and 622 is selective to the nitride and does not affect, or minimally affects, the protection oxides 618 and 620 and the trench oxide 610, so that these elements remain undisturbed by the removal of the isolation nitride.

Figure 6E:
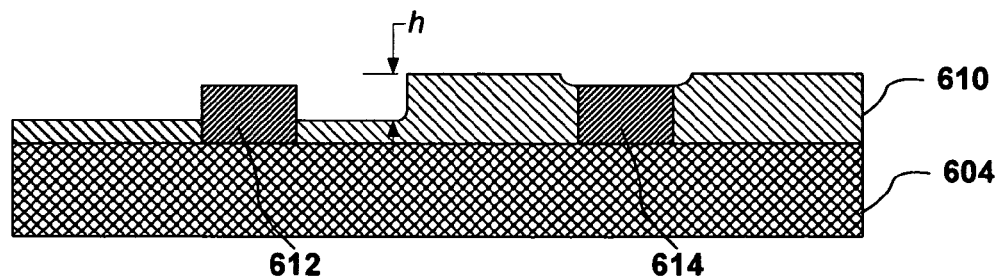

FIG. 6E illustrates the transistor construction after removal of the protective pad oxides 616 and 620. Starting with the construction of FIG. 6D, in one embodiment the pad oxides 616 and 620 are etched away from the diffusions 612 and 614 using a wet etch. The etchant used to remove the pad oxides 616 and 620 also etches the trench oxide 610, resulting in an overall thinning of trench oxide 610. Because the trench oxide etches at the same rate everywhere, however, the depth h between the trench oxide surrounding diffusion 612 and the trench oxide surrounding diffusion 614 remains approximately the same as before.

Figure 6F:
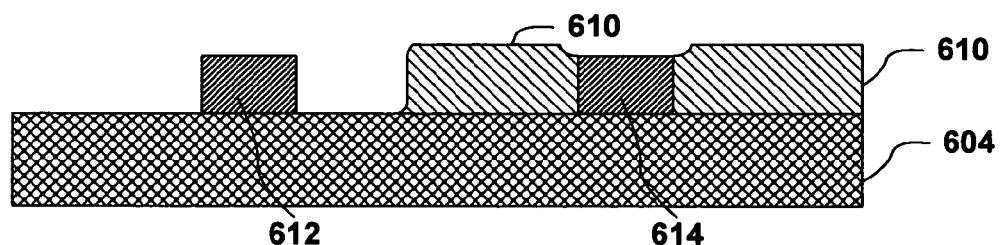

FIG. 6F illustrates the transistor construction after sacrificial oxide growth and removal. Starting with the construction of FIG. 6E, a sacrificial oxide layer (not shown) is grown on the trench oxide 610 and the diffusions 612 and 614. The sacrificial oxide is then etched away, leaving behind diffusion 612 and diffusion 614. Diffusion 612 may not be surrounded by any trench oxide and will be used to form a tri-gate transistor, while diffusion 614 continues to have trench oxide 610 on either side and will be used to form a planar transistor.

Figure 6G:
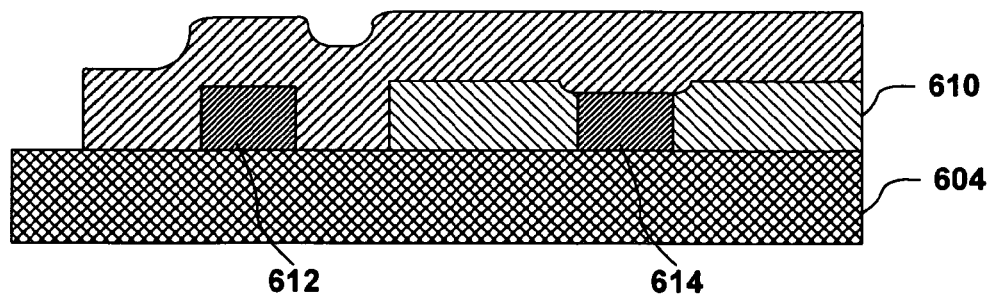

FIG. 6G illustrates the transistor construction after the deposit and etching of a gate electrode 626. Gate electrode 626 is deposited on substrate 604 such that it surrounds diffusion 612 on three sides, thus forming a tri-gate transistor. A layer of dielectric normally separates the diffusion 612 from gate electrode 626, but for the sake of clarity that dielectric layer is not shown in the figure. Gate electrode 626 is also deposited on top of trench oxide 610 and on the top surface of diffusion 614. Diffusion 614 thus becomes part of a planar transistor. As with the tri-gate transistor, a dielectric layer normally separates diffusion 614 from gate electrode 626, but for the sake of clarity that dielectric layer is not shown in the figure. It is easy to see that the process is applicable to a bulk substrate. The transistor on diffusion 614 can be made into a trigate transistor with shallow sidewall by properly budgeting the amount of recess in isolation oxide. Therefore, trigate transistors of different strengths can be fabricated with a similar process.

Figure 7A:
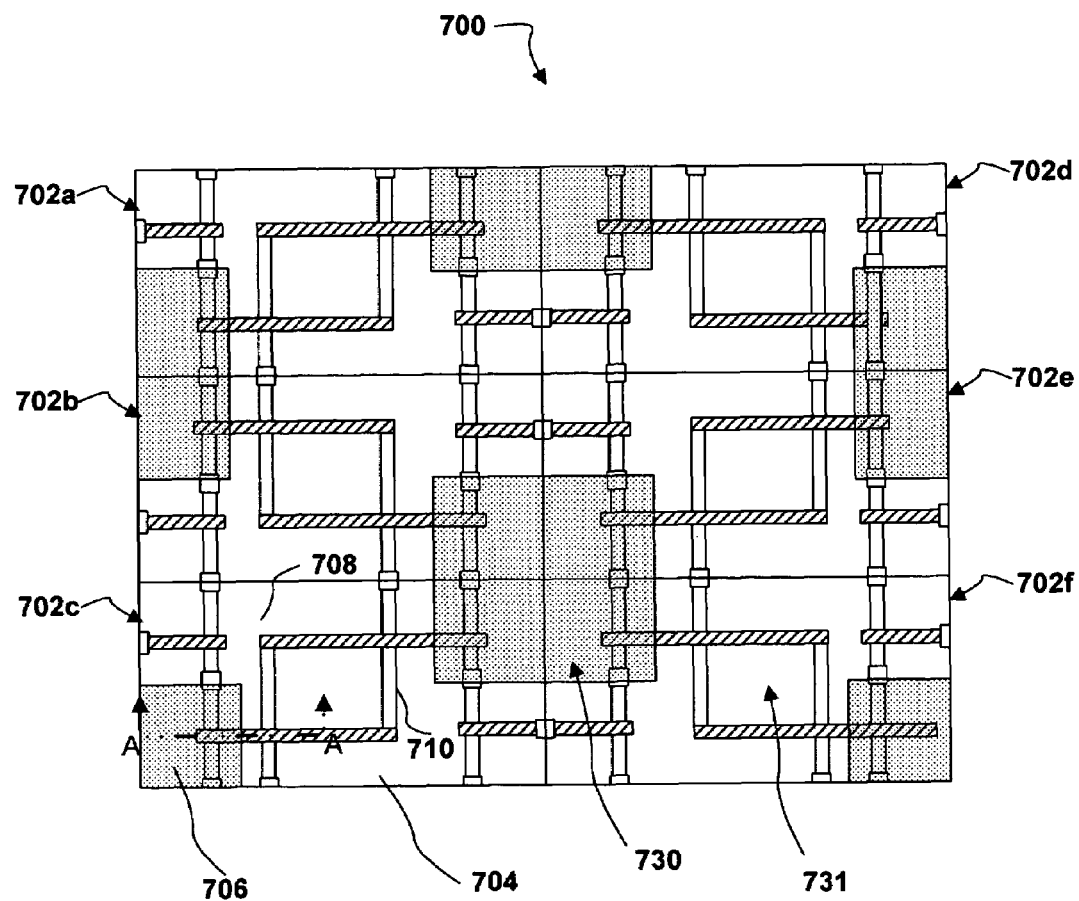
FIG. 7A is a plan view of a group of SRAM cells masked to create a group of SRAM cells according to the present invention.
Figure 7B:
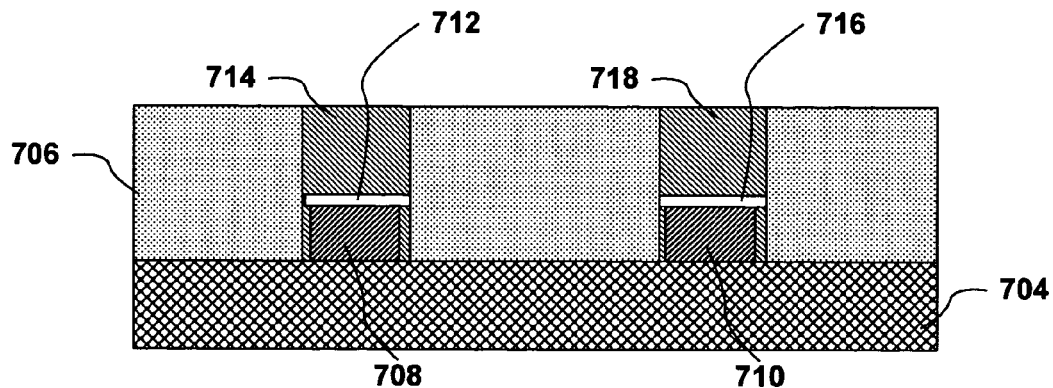
FIGS. 7B-7I are cross-sectional elevations taken substantially along section line A-A in FIG. 7A, showing an alternative embodiment of a process for building an embodiment of an SRAM cell according to the present invention.

FIGS. 7A-7I illustrate an alternative embodiment of a process for building an embodiment of an SRAM cell that integrates two different transistor constructions, such as SRAM cell 300. FIG. 7B illustrates an initial state of the SRAM cell, in which diffusion 708 is formed on substrate 704, along with pad oxide 712 and isolation nitride 714 on top of diffusion 708. Similarly, diffusion 710 is patterned onto the substrate 704, and pad oxide 716 and isolation nitride 718 are patterned on top of diffusion 710. A trench etch is performed and, with isolation nitrides 714 and 718 on, protection oxide is grown on the side walls of diffusions 708 and 710. Growth of the protective oxide is followed by deposit of sacrificial trench fill layer 706 in the trenches and planarization using isolation nitrides 714 and 718 as polish stops. In one embodiment, the sacrificial trench fill layer 706 may be polysilicon.

Figure 7C:
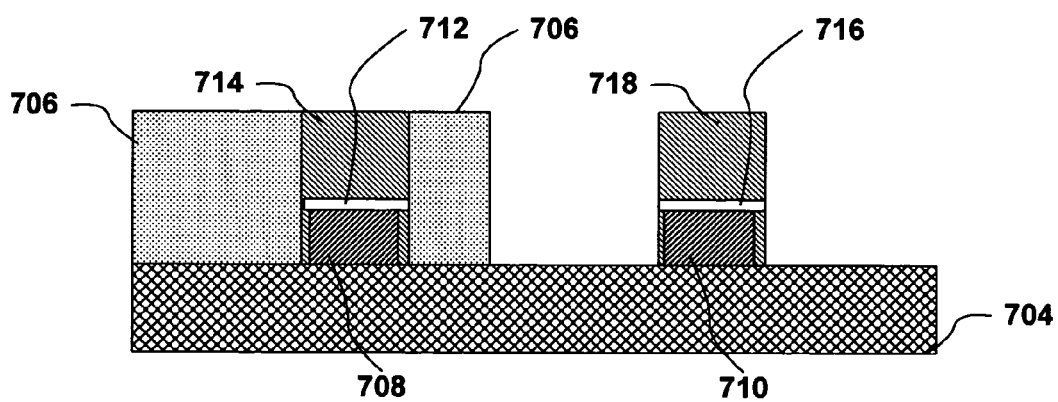

FIGS. 7A and 7C together illustrate the cell construction after an initial patterning and etching. FIG. 7A illustrates a set of SRAM cells 700 made up of six individual SRAM cells 702a-702f formed on substrate 704. As discussed above for FIG. 7B, the diffusions 708 and 710 have been patterned and on the substrate 704. Gate electrodes have not yet been formed at this stage, but they are nonetheless shown in FIG. 7A to illustrate their position. FIG. 7C shows the cross section along section line A-A in FIG. 7A. Starting with the construction as shown in FIG. 7B, photoresist is deposited, exposed and developed to open up the areas for polysilicon etch. Once the polysilicon is opened up, it is etched as shown in FIG. 7C.

Figure 7D:
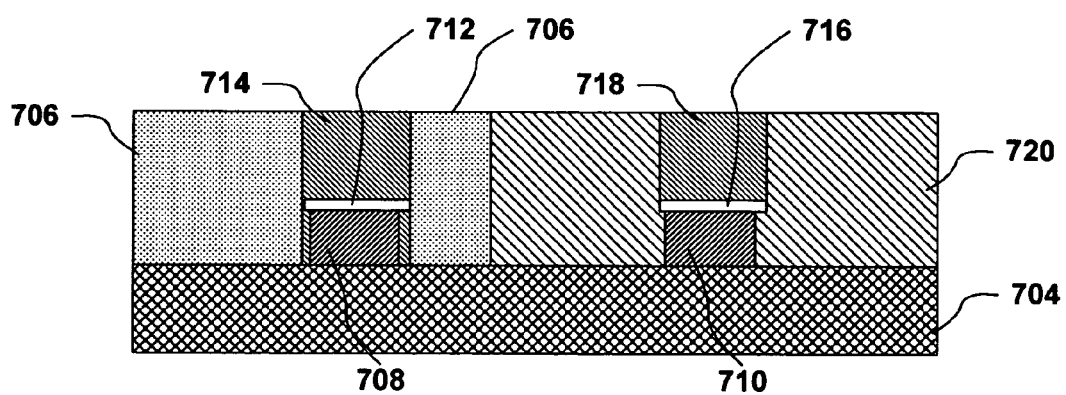

FIG. 7D illustrates the transistor construction after the deposit of a trench oxide. Starting with the construction of FIG. 7C, a trench oxide 720 is deposited on substrate 704 in the areas where polysilicon 706 was etched away, in this case on either side of diffusion 710, protection oxide 716 and isolation nitride 718. After trench oxide 720 is deposited, the entire assembly is again planarized to make trench oxide 720 substantially flush with polysilicon 706.

Figure 7E:
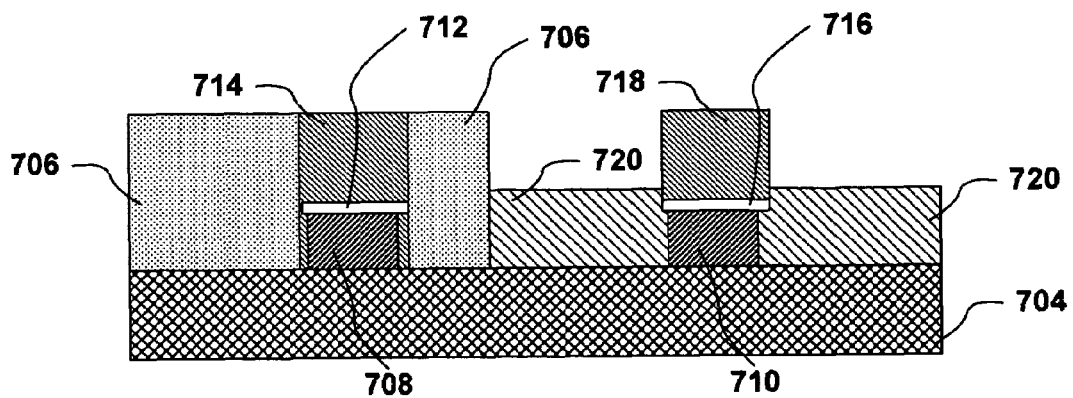

FIG. 7E illustrates the cell construction after a wet or a dry etch of oxide 720. Starting with the construction of FIG. 7D, trench oxide 720 may be recessed using a wet etch such as a typical shallow trench isolation (STI) process. In one embodiment, this recess etch, either a dry etch or a wet etch, may have a very high selectivity for the trench oxide, meaning that they etch the trench oxide 702 without substantially etching or otherwise affecting the polysilicon 706. If a wet etch is used, the etch may need to stop at a level above the pad oxide 716 to avoid lifting the isolation nitride and subjecting the diffusion 710 to subsequent etch removal of the sacrificial trench fill 706. A dry etch may etch below the pad oxide level and leave a sidewall protection layer for the diffusion 710 against subsequent etches. The deeper etch may provide a trigate transistor with shallow sidewall.

Figure 7F:
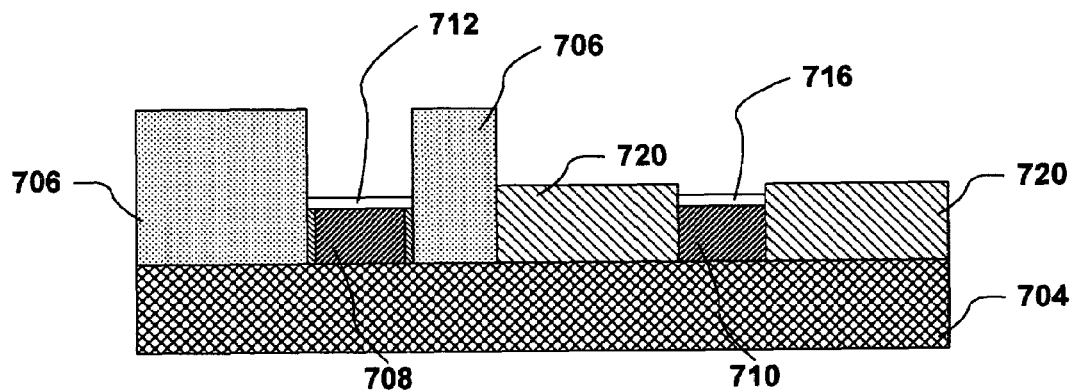

FIG. 7F illustrates the cell construction after removal of the isolation nitrides 714 and 718. Starting with the construction shown in FIG. 7E, isolation nitride 714 and isolation nitride 718 are both removed through appropriate etching. The etchant used to remove isolation nitride 618 and 622 is selective to the nitride and does not affect, or minimally affects, the protection oxides 712 and 716, the trench oxide 720 and the sacrificial trench fill 706 so that these elements remain undisturbed by the removal of the isolation nitride.

Figure 7G:
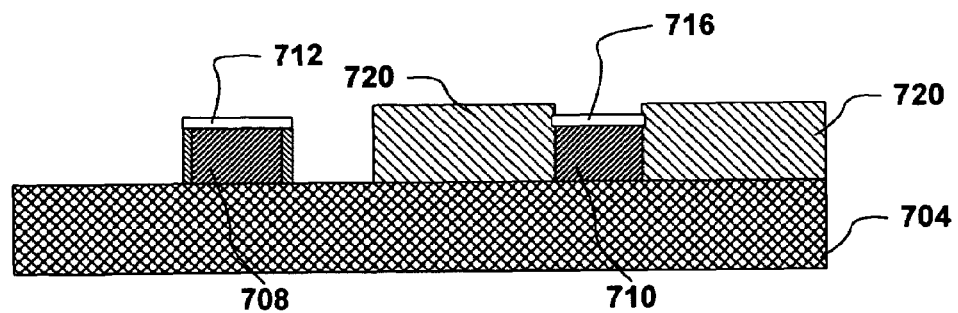

FIG. 7G illustrates the cell construction after removal of the sacrificial trench fill 706. Starting with the construction of FIG. 7F, sacrificial trench fill 706 is removed from either side of diffusion 708 and pad oxide 712 through appropriate etching. The etchant used to remove 706 does not affect, or minimally affects, the protection oxides 712 and 716 and trench oxide 720 so that these elements and diffusions 708 and 710 remain undisturbed by the removal of the sacrificial trench fill 706. In one embodiment, the sacrificial trench fill is polysilicon which can be easily removed without attacking silicon oxide and silicon nitride. In one embodiment, the sacrificial trench fill 706 may be removed before the removal of the isolation nitride.

Figure 7H:
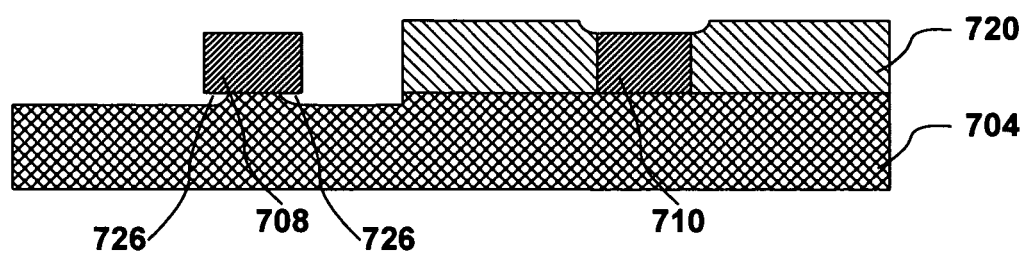

FIG. 7H illustrates the cell construction after removal of pad oxides. Starting with the construction of FIG. 7G, pad oxides 712 is etched away from diffusion 708 and pad oxide 716 is etched away from diffusion 710. The etchants used to remove the pad oxides also create some etching in the trench oxide 720 and the substrate 704. In the substrate 704, the etching results in slight undercuts 726 between diffusion 708 and the substrate. Undercuts 726 do not, however, substantially affect the construction or operation of the resulting transistor.

Figure 7I:
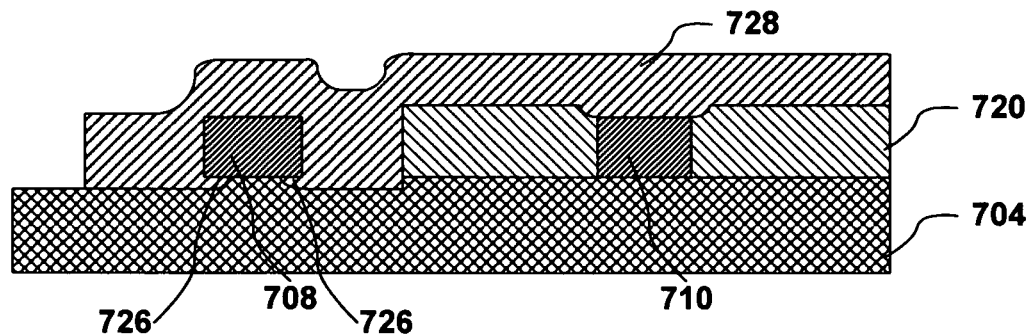

FIG. 7I illustrates the cell construction after deposit and etching of the gate electrode 728. Starting with the construction of FIG. 7H, gate electrode 728 is deposited on substrate 704 such that it surrounds diffusion 708 on three sides, thus forming a tri-gate transistor. A layer of dielectric normally separates the diffusion 708 from gate electrode 728, but for the sake of clarity that dielectric layer is not shown in the figure. Gate electrode 728 is also deposited on top of trench oxide 720 and on the top surface of diffusion 710. Diffusion 710 thus becomes part of a planar transistor. As with the tri-gate transistor, a dielectric layer normally separates diffusion 710 from gate electrode 728, but for the sake of clarity that dielectric layer is not shown in the figure.

The current invention has been illustrated with 2 process options on SOI substrate. These processes are also applicable to bulk wafers. The transistors integrated on one substrate may include planar transistors and tri-gate transistors of various sidewall heights to provide different transistor strengths with the same or similar layout. Once the diffusions and isolations structures are formed, the transistor gate may be processed to be traditional polysilicon gate or high-k/metal gate.

Figure 8:
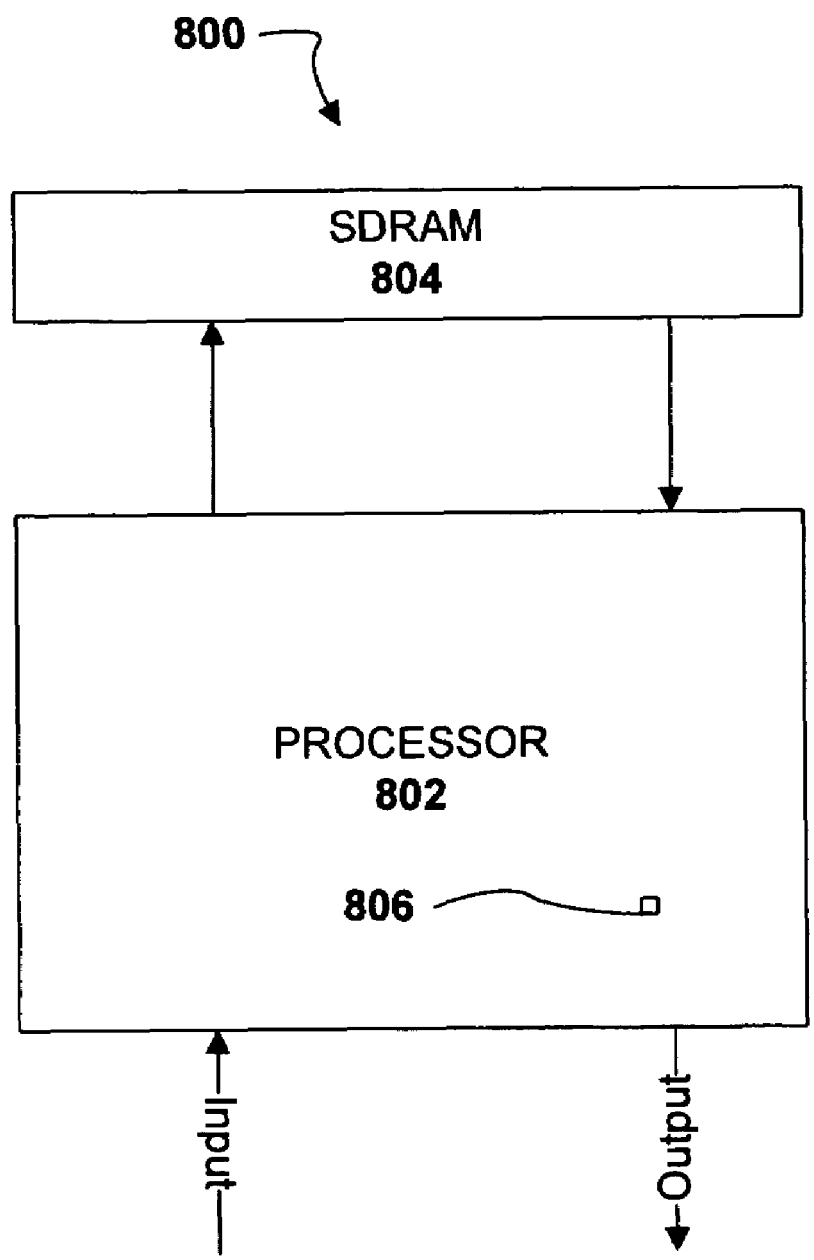
FIG. 8 is a schematic of an embodiment of a system including an embodiment of an SRAM cell according to the present invention.

FIG. 8 illustrates a system 800 according to the present invention. In the system 800, a processor 802 is coupled to a memory such as SDRAM 804 with which it exchanges data while performing operations. The processor 802 also includes an input and an output through which the processor 802 receives data from and transmits data to other components with which the processor 802 can be connected. Within the processor 802 are one or more SRAM cells 806, which in one embodiment can be configured similarly to SRAM cell 300.

The above description of illustrated embodiments of the invention, including what is described in the abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

The invention claimed is:

1. An apparatus comprising:
   a first diffusion formed on a substrate, the first diffusion including a pair of channels, each of which separates a source from a drain;
   a second diffusion formed on the substrate, the second diffusion including a channel that separates a source from a drain;
   a first gate electrode formed on the substrate, wherein the first gate electrode overlaps one of the pair of channels on the first diffusion to form a first pass-gate transistor;
   a second gate electrode formed on the substrate, wherein the second gate electrode overlaps one of the pair of channels of the first diffusion to form a first pull-down transistor and overlaps the channel of the second diffusion to form a first pull-up transistor, and wherein the pass-gate, pull-down and pull-up transistors are of at least two different constructions;
   a third diffusion formed on the substrate, the third diffusion including a channel that separates a source from a drain;
   a fourth diffusion formed on the substrate, the fourth diffusion including therein a pair of channels, each channel separating a source from a drain;
   a third gate electrode formed on the substrate, wherein the third gate electrode overlaps one of the pair of channels on the fourth diffusion to form a second pass-gate transistor; and
   a fourth gate electrode formed on the substrate, wherein the fourth gate electrode overlaps one of the pair of channels of the fourth diffusion to form a second pull-down transistor and overlaps the channel of the third diffusion to form a second pull-up transistor, and wherein the second pass-gate, pull-down and pull-up transistors are of at least two different constructions.

2. The apparatus of claim 1 wherein each diffusion has constant width.

3. The apparatus of claim 1 wherein each gate electrode has constant width.

4. The apparatus of claim 1 wherein the first pass-gate and first pull-up transistors are planar transistors and the first pull-down transistor is a tri-gate transistor.

5. The apparatus of claim 1 wherein the first pass-gate transistor is a planar transistor and the first pull-up and first pull-down transistors are tri-gate transistors.

6. The apparatus of claim 1 wherein the second pass-gate and second pull-up transistors are planar transistors and the second pull-down transistor is a tri-gate transistor.

7. The apparatus of claim 1 wherein the second pass-gate transistor is a planar transistor and the second pull-up and second pull-down transistors are tri-gate transistors.

8. The apparatus of claim 1 wherein the second gate electrode is coupled to the third diffusion and the fourth gate electrode is coupled to the second diffusion.

* * * * *